(12) United States Patent
Nonogaki et al.

(10) Patent No.: US 8,519,608 B2
(45) Date of Patent: Aug. 27, 2013

(54) ELECTRON SOURCE AND ELECTRON BEAM APPARATUS

(75) Inventors: Ryozo Nonogaki, Shibukawa (JP); Yoshinori Terui, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 534 days.

(21) Appl. No.: 12/680,918

(22) PCT Filed: Oct. 3, 2008

(86) PCT No.: PCT/JP2008/068077
§ 371 (c)(1),
(2), (4) Date: Mar. 31, 2010

(87) PCT Pub. No.: WO2009/044871
PCT Pub. Date: Apr. 9, 2009

(65) Prior Publication Data
US 2010/0237762 A1    Sep. 23, 2010

(30) Foreign Application Priority Data

Oct. 5, 2007 (JP) .................................. 2007-262046
Mar. 11, 2008 (JP) .................................. 2008-054359

(51) Int. Cl.
*H01J 1/02* (2006.01)
*H01J 1/62* (2006.01)
*H01J 1/304* (2006.01)

(52) U.S. Cl.
USPC ............ 313/310; 313/311; 313/336; 313/351

(58) Field of Classification Search
USPC .................................. 313/310, 311, 351, 309
See application file for complete search history.

(56) References Cited

U.S. PATENT DOCUMENTS

| 4,193,013 A | 3/1980 | Futamoto et al. |
| 6,930,313 B2 * | 8/2005 | Fujieda et al. ............ 250/423 R |

FOREIGN PATENT DOCUMENTS

| JP | 48-27623 | 8/1973 |
| JP | 51-55666 | 5/1976 |
| JP | 55-109343 | 8/1980 |
| JP | 55-148339 | 11/1980 |
| JP | 62-219443 | 9/1987 |
| JP | 4-215231 | 8/1992 |
| JP | 5-41057 | 6/1993 |
| JP | 2004-265614 | 9/2004 |
| JP | 2005-222945 | 8/2005 |
| JP | 2005-332677 | 12/2005 |
| JP | 2005-339922 | 12/2005 |

OTHER PUBLICATIONS

English-language abstract of Japanese H5-41057.

(Continued)

*Primary Examiner* — Joseph L Williams
(74) *Attorney, Agent, or Firm* — Stein IP, LLC

(57) ABSTRACT

Provided is an electron source which outputs a stable electron beam even when vibration is applied from the external to an apparatus which uses the electron source. The electron source is provided with an insulator (5); two conductive terminals (4) arranged at an interval on the insulator (5); a long filament (3) stretched between the conductive terminals (4); and a needle-like cathode (1) having an electron emitting section attached to the filament (3). The vertical cross-section shape of the filament (3) in the axis direction has a long direction and a short direction, and the maximum length in the long direction is 1.5 times or more but not more than 5 times the maximum length in the short direction.

9 Claims, 6 Drawing Sheets

(56) References Cited

OTHER PUBLICATIONS

European Search Report dated Dec. 7, 2011, issue in corresponding European Patent Application No. 08836265.2-2208 / 2197015 PCT/JP2008068077.

D. Tuggle et al., "Application of a Thermal Field Emission Source for High Resolution, High Current e-beam Microprobes," *J. Vac. Sci. Technol.*, 16(6), Nov./Dec. 1979, pp. 1699-1703.

Search Report issued in International Patent Application PCT/JP2008/068077 on Nov. 4, 2008.

* cited by examiner (a)

(b)

(a)  (b)

ELECTRON SOURCE AND ELECTRON BEAM APPARATUS

CROSS-REFERENCE TO RELATED APPLICATIONS

This application is a national stage application of PCT Application No. PCT/JP2008/068077, filed Oct. 3, 2008, which claims the benefit of PCT International Patent Application No. PCT/JP2008/054359, filed Mar. 11, 2008, and Japanese Patent Application No. 2007-262046, filed Oct. 5, 2007, all filed in the Japanese Intellectual Property Office, the disclosures of which are incorporated herein by reference.

BACKGROUND OF THE INVENTION

1. Field of the Invention

The present invention relates to an electron source having a needle cathode, and an electron beam apparatus using such an electron source, such as a scanning electron microscope, a scanning transmission electron microscope, an Auger electron spectroscope, an electron beam lithography apparatus or a wafer inspection apparatus.

2. Description of the Related Art

In recent years, electron sources using cathodes with monocrystalline tungsten needle electrodes having coating layers of zirconium and oxygen (hereinafter referred to as ZrO/W electron sources) have been used to obtain electron beams that are brighter and have a longer operating life than thermionic cathodes (see Non-Patent Document 1).

ZrO/W electron sources are obtained by providing a reservoir consisting of zirconium and oxygen on a needle cathode composed of tungsten monocrystals having an axial orientation in the <100> orientation, so that the zirconium and oxygen are diffused to form a coating layer (hereinafter referred to as a ZrO coating layer), said ZrO coating layer reducing the work function of the (100) plane of the tungsten monocrystals from 4.5 eV to about 2.8 eV, so that only the minuscule crystalline facet corresponding to the (100) plane formed at the tip of this cathode forms an electron emission region, as a result of which an electron beam that is brighter than that of conventional thermionic cathodes can be obtained, and the operating life is also prolonged. Techniques of appropriately processing the shapes of the cathode tips are also known as methods for stabilizing the supply of electrons in the aforementioned cathodes (see Patent Document 1).

Additionally, techniques of forming the aforementioned coating layers of barium and oxygen are also known (see Patent Document 2, Patent Document 3 and Patent Document 4).

As shown in FIG. 7, a ZrO/W electron source comprises a needle cathode 1 of tungsten in the <100> orientation for emitting an electron beam attached by welding or the like to a portion of a tungsten filament 3 provided on a conductive terminal 4 anchored to insulator 5. A reservoir 2 of zirconium and oxygen is formed in a portion of the cathode 1. While not shown in the drawings, the surface of the cathode 1 is covered with a ZrO coating layer.

The tip portion of the cathode 1 of the ZrO/W electron source is positioned between a suppressor electrode and an extractor electrode. The cathode 1 is electrically heated to about 1800 K by means of the filament 3, and generally, a high negative voltage is applied between the extractor electrode and the cathode 1, while a negative voltage of a few hundred volts is applied between the cathode 1 and the suppressor electrode, to suppress thermal electrons emitting from the filament 3.

While ZrO/W electron sources are widely used in critical dimension SEM and wafer inspection equipment at low accelerating voltages, when observing SEM images at relatively high magnifications, vibrations from around the equipment can generate noise, thus reducing the resolution, sometimes to such a degree that measurements are not possible. The filament 3 of a ZrO/W electron source tends to vibrate in a direction perpendicular to the plane formed by three points, these being the cathode 1 and the two portions where it connects to the conductive terminals 4, and the vibrations will have a characteristic frequency. It is known that when the frequency of external vibrations matches with this characteristic frequency, the filament can resonate, thus generating noise.

On the other hand, while differing completely from the present invention in terms of the field and applications, degradation of properties due to the generation of noise by minute vibrations is not considered to be problematic in electron sources having planar cathodes with large electron emission regions such as those used in cathode ray tubes for displaying images (see Patent Document 5 and Patent Document 6).

Additionally, in the case of electron sources comprising planar cathodes with large electron emission regions of this kind, wide filaments are used to make it easier to mount the cathode. Generally, the operating temperature of these electron sources is rather low, about 1000 K, and heat can be maintained with relatively little current even when a wide filament is used.

Non-Patent Document 1: D. Tuggle, *J. Vac. Sci. Technol.*, 16, p. 1699 (1979).
Patent Document 1: JP 2005-339922 A
Patent Document 2: JP 2004-265614 A
Patent Document 3: JP 2005-332677 A
Patent Document 4: JP 2005-222945 A
Patent Document 5: JP S55-148339 A
Patent Document 6: Japanese Utility Model Application, Publication No. S48-27623

DISCLOSURE OF INVENTION

Problems to be Solved by the Invention

Electron sources having needle cathodes, particularly those with an electron emission region of about 100 µm or less, have an operating temperature of at least 1700 K, making them very difficult to heat to the operating temperature if the filament cross section is large. Therefore, a thin filament with a small cross section is usually used. As a result, the filament can become less rigid, making it susceptible to the influence of vibrations. While attempts have been made to suppress such vibrations by providing an anti-vibration structure, the resonance cannot be completely eliminated unless the apparatus is made very complicated.

While the vibration amplitude can be somewhat reduced by making the filament thicker to increase the rigidity, as mentioned above, thickening the filament causes the cross section to become larger, thus increasing the current that is necessary for electrical heating. Since there are limits on the electrical heating current depending on the current capacity of electron beam apparatus, it is not sufficient to simply make them thicker.

<Development of the Invention>

As a result of diligent research, the present inventors found that the filament is most susceptible to vibrations in the direction perpendicular to the plane formed by three points, i.e. the cathode and the two locations where the filament is attached to the conductive terminals, and by studying shapes increasing the rigidity of the filament in the direction susceptible to vibrations without increasing the filament cross section so as to suppress increases in the current necessary for electrical heating, they arrived at the present invention.

That is, the purpose of the present invention is to offer an electron source and electron beam apparatus providing an electron beam that remains stable even when subject to external vibrations.

Means for Solving the Problems

The present invention offers an electron source comprising an insulator; two conductive terminals arranged spaced apart on the insulator; a long filament mounted between the conductive terminals; and a needle cathode attached to the filament and having an electron emitting portion; the cross sectional shape of the filament in a direction perpendicular to an axial direction having a long direction and a short direction; the maximum length in the long direction being at least 1.5 times and at most 5 times the maximum length in the short direction; and the filament being mounted such that the long direction of the cross sectional shape of the filament has an angle of ±10° with respect to the normal to the plane formed by three points which are the position of the cathode and the two positions where the filament is attached to the conductive terminals.

Effects of the Invention

According to the present invention, when the electron source is put into practical application, noise generated by the electron source resonating due to vibrations from around the apparatus can be prevented, and increases in the current necessary for electrical heating of the filament can be suppressed.

Description of the Reference Numbers

| 1 | cathode |
| 2 | reservoir |

-continued

Description of the Reference Numbers

| 3 | filament |
| 4 | conductive terminal |
| 5 | insulator |
| 6 | electron source |
| 7 | laser displacement meter |
| 8 | acceleration sensor |
| 9 | vibrating plate |
| 10 | vibration generator |
| 11 | laser beam |
| a | length of filament cross section in long direction |
| b | length of filament cross section in short direction |
| L | length of filament |
| θ | angle between filaments |
| m | thickness of cathode |
| n | length of cathode |
| s | diameter of electron emitting portion of cathode |

BEST MODES FOR CARRYING OUT THE INVENTION

<Embodiments>

Herebelow, specific embodiments of the present invention shall be described with reference to the drawings.

As shown in FIG. 1(a), the electron source according to the present embodiment is an electron source comprising an insulator 5; two conductive terminals 4 arranged spaced apart on the insulator 5; a long filament 3 mounted between the conductive terminals 4; and a needle cathode 1 attached to the filament 3 and having an electron emitting portion; the cross sectional shape of the filament 3 in a direction perpendicular to an axial direction having a long direction and a short direction; the maximum length in the long direction being at least 1.5 times and at most 5 times the maximum length in the short direction; and the filament 3 being mounted such that the long direction of the cross sectional shape of the filament 3 has an angle of ±10° with respect to the normal to the plane formed by three points which are the position of the cathode and the two positions where the filament 3 is attached to the conductive terminals.

Figure 1:
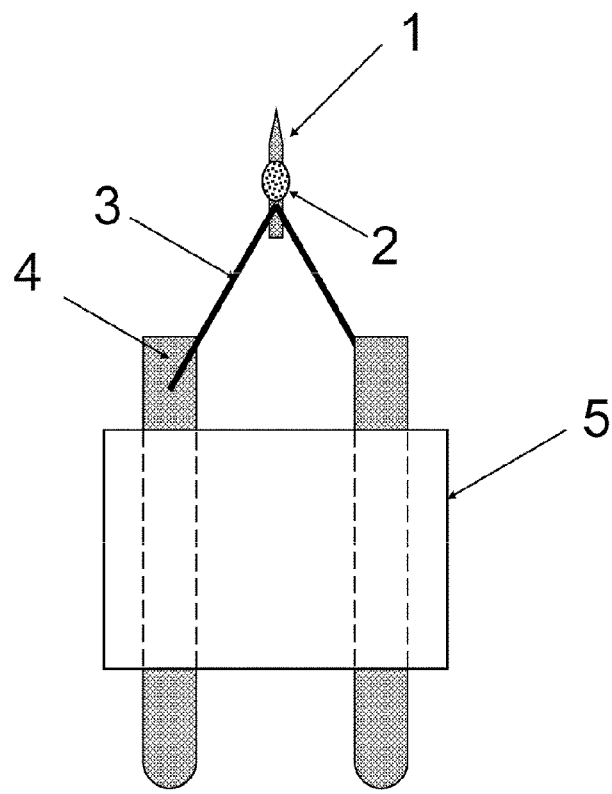
FIG. 1 (a) A diagram showing the structure of an electron source according to an embodiment of the present invention, and (b) a schematic diagram having an enlarged cross section in a direction perpendicular to the direction of the axis of the filament 3.
Figure 1:
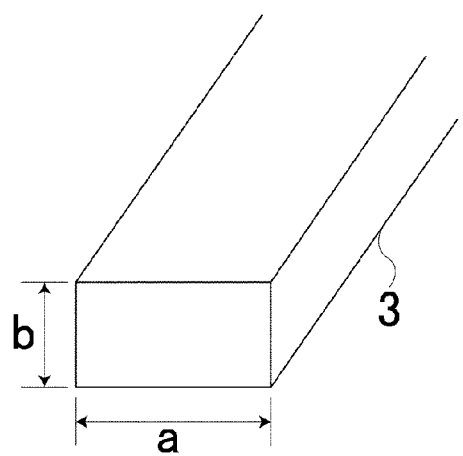

FIG. 1 is a diagram showing the structure of an electron source according to an embodiment of the present invention (FIG. 1(a)) and an enlarged view of a cross section perpendicular to the direction of the axis of the filament 3 (FIG. 1(b)). In FIG. 1(a), reference number 2 denotes a reservoir provided in the cathode 1.

[Filament]

First, the filament 3 of an electron source according to the present embodiment will be described. As shown in FIG. 1(b), the cross sectional shape of the filament 3 in a direction perpendicular to the axis of the filament 3 has a long direction and a short direction.

In the present embodiment, the example is such that the cross sectional shape in a direction perpendicular to the axis of the filament 3 is rectangular as shown in FIG. 1(b), but this cross sectional shape may be any in which the above-indicated ratio between the maximum lengths in the long and short directions can be maintained. Examples of other potential cross sectional shapes include ellipses, diamonds, and rectangles with short sides that are semicircular.

When the filament 3 has a rectangular cross section as shown in FIG. 1(b), the maximum length in the long direction corresponds to the long side of the rectangle and the maximum length in the short direction corresponds to the short side of the rectangle. Additionally, when the cross sectional shape of the filament 2 is elliptical or diamond-shaped, the maximum length in the long direction refers to the longest line segment among the line segments passing through the center (center of gravity) of the cross sectional shape, and the maximum length in the short direction refers to the shortest line segment among the line segments passing through the center (center of gravity) of the cross sectional shape.

Regarding the maximum length in the long direction (a in FIG. 1(b)) and the maximum length in the short direction (b in FIG. 1(b)) of the cross sectional shape of the filament 3, a length that enables heating to a temperature of actual use must be chosen, within the limits on the current and voltage for the power supply used to electrically heat the filament.

The cross section of the filament 3 should preferably be such that the maximum length in the long direction is at least 1.5 times and at most 5 times the maximum length in the short direction. By setting this ratio for the cross section of the filament 3, it can be heated with an appropriate current, and noise generated by resonation of the electron source with vibrations from around the apparatus can be effectively prevented.

For example, even if the cross sectional area of the filament 3 is the same, if the ratio between the maximum length b in the short direction and the maximum length a in the long direction is set to 5 times or less, then increases in the current necessary for heating due to radiation loss at the time of heating, which accompany increases in filament surface area, can be suppressed. Additionally, when set to 1.5 times or more, satisfactory vibration prevention effects can be achieved. In other words, by setting the ratio of the maximum length a in the long direction with respect to the maximum length b in the short direction to be at least 1.5 and at most 5, the characteristic effects of the present invention can be achieved.

Additionally, the ratio between the maximum length a in the long direction and the maximum length b in the short direction preferably has a lower limit of 2, and preferably has an upper limit of 4. With this ratio, the generation of noise due to resonation of the electron source with vibrations from around the apparatus can be prevented and stable heating can be achieved, thereby enabling stable electron beams to be obtained.

(Cross Sectional Area of Filament)

The cross sectional area of the filament 3 (the area of the cross section perpendicular to the axial direction of the filament 3) is preferably at least $0.01$ mm$^2$ and at most $0.015$ mm$^2$. More preferably, the cross sectional area of the filament 3 is at least $0.011$ mm$^2$ and at most $0.013$ mm$^2$.

If the cross sectional area of the filament 3 is $0.015$ mm$^2$ or less, then a thermal gradient arises between the cathode 1 and the conductive terminal 4, and it can be heated with an appropriate current. Additionally, if the cross sectional area of the filament 3 is $0.01$ mm$^2$ or more, then the vibrations of the cathode 1 can be suppressed. Furthermore, if the cross sectional area of the filament 3 is at least $0.011$ mm$^2$ and at most $0.015$ mm$^2$, then it can be heated to the operational temperature with a filament current roughly equal to that of a conventional electron source using a filament with a circular cross section, making it easy to substitute.

(Length of the Filament)

Figure 3:
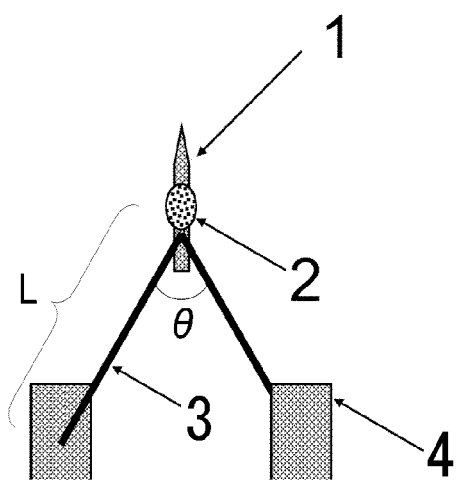
FIG. 3 A diagram showing the structure of a filament portion of an electron source according to an embodiment of the present invention.

Additionally, the length of the filament 3 is preferably at least 3 mm and at most 8 mm. The length of the filament 3 here refers to the length L from one tip of the filament 3 to the point of contact between the cathode 1 and the filament 3, as shown in FIG. 3.

If the length of the filament 3 is 8 mm or less, then vibrations of the cathode 1 can be suppressed. Additionally, if the length of the filament 3 is 3 mm or more, then it can be heated with an appropriate current.

More preferably, the length of the filament 3 is at least 4 mm and at most 6 mm. When the length of the filament 3 is at least 4 mm and at most 6 mm, the length is roughly the same as conventional electron sources using filaments with a circular cross section, so they are structurally easy to substitute.

(Angle of Filament)

The angle of the filament 3 should preferably be at least 30° and at most 120°. The angle of the filament 3 here refers to the angle θ formed by the filament 3 which is bent in the shape of a V on the plane formed by the three points which are the position of the cathode 1 and the two positions of attachment between the filament 3 and the conductive terminals 4, as shown in FIG. 3.

If the angle of the filament 3 is at least 30°, then the spacing between the conductive terminals 4 will be adequate. Additionally, if the angle of the filament 3 is at most 120°, it is possible to easily produce an electron source having a structure wherein the needle cathode projects from a hole provided in a suppressor electrode.

More preferably, the angle of the filament 3 is at least 45° and at most 90°. If the angle of the filament 3 is at most 45° and at most 90°, then this is about the same angle as in conventional electron sources using filaments of circular cross section, making them structurally more easy to substitute.

Figure 2:
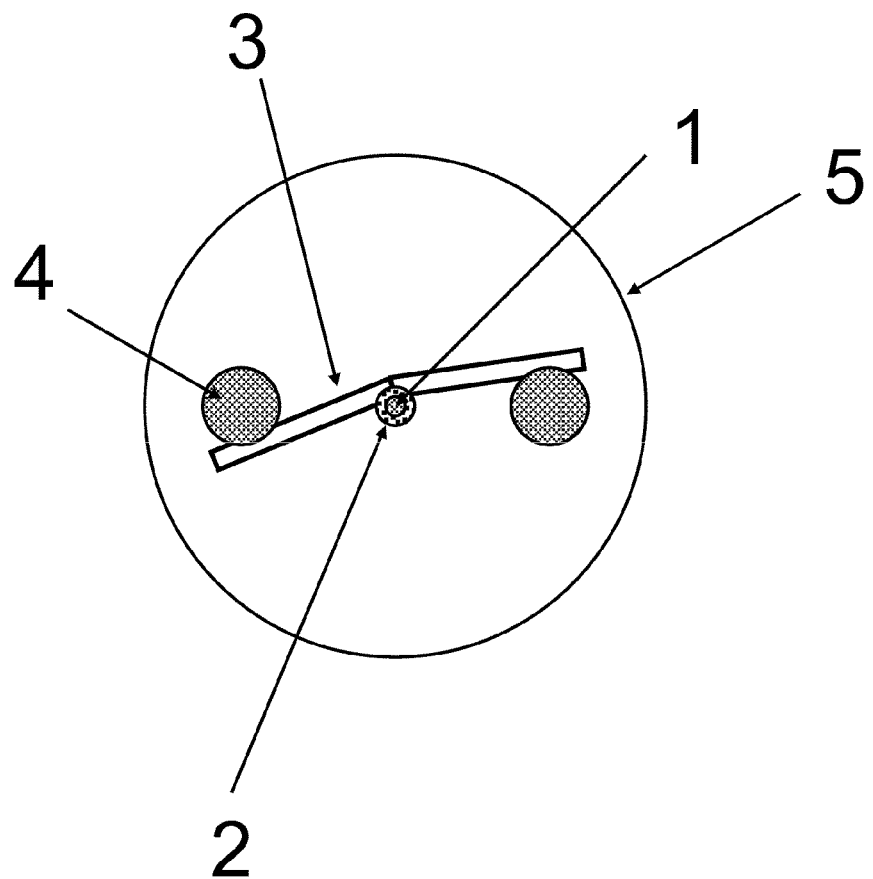
FIG. 2 A diagram showing the structure of an electron source according to an embodiment of the present invention (the electron source of FIG. 1 seen from the direction of the cathode).
Figure 4:
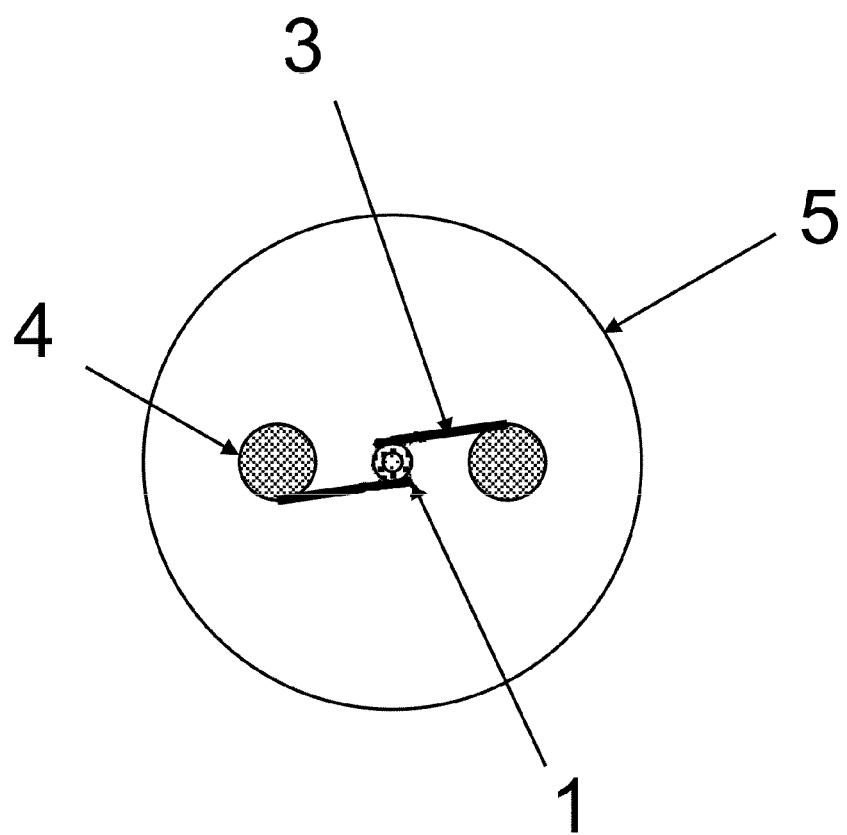
FIG. 4 A diagram showing another structure of an electron source according to an embodiment of the present invention (the electron source of FIG. 1 seen from the direction of the cathode).

In the present embodiment the filament 3 is formed by a single filament that is bent in the shape of a V, as shown in FIG. 1 and FIG. 2. However, the filament 3 may be a structure wherein the cathode 1 is held between two filaments of the same length, as shown in FIG. 4.

In the case of a filament 3 consisting of two filaments as in this case, the length of the filament 3 refers to the length of one of the filaments. Additionally, the angle of the filament 3, as in the above definition, refers to the angle between the two filaments.

In the electron source of the present embodiment, the filament 3 should preferably be composed of a metal chosen from among tungsten, molybdenum, rhenium, tantalum and iridium, or an alloy containing at least one chosen from among these elements.

[Cathode]

Figure 5:
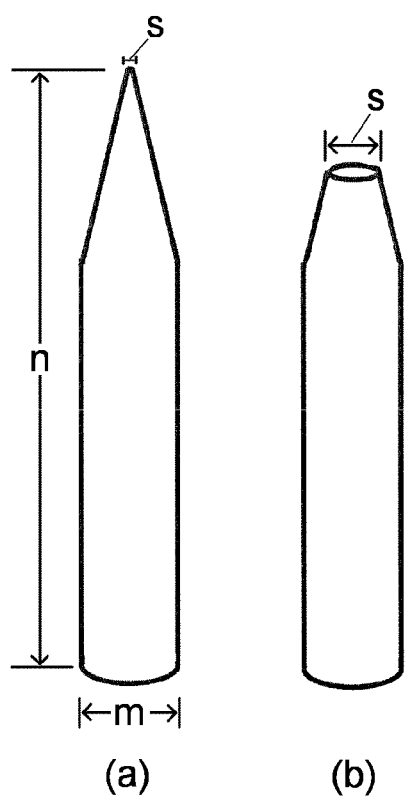
FIG. 5 A schematic view of a cathode of an electron source according to an embodiment of the present invention.

Next, the cathode 1 of the electron source according to the present embodiment shall be explained. As shown in FIG. 5(a), the cathode 1 is preferably in the form of a needle combining a cylinder with a thickness m of 0.1 mm to 0.15 mm and a length n of 1.0 mm to 1.8 mm, and a cone of which the diameter s of the electron emitting portion on a tip portion is 2 μm or less. The shape of the tip portion may be flat, or roughly spherical.

By forming the tip in the shape of a needle and limiting the electron emissions to a small area, brighter electron emissions are achieved. Additionally, in the case of a cathode of this shape, the material should preferably be tungsten or molybdenum. Furthermore, the cathode 1 may consist of tungsten or molybdenum monocrystals in the <100> orientation, and a portion of the cathode should preferably have a reservoir with oxides of elements chosen from among Ca, Sr, Ba, Sc, Y, La, Ti, Zr, Hf and the lanthanides, but the invention is not limited to such an embodiment.

Additionally, in applications that require a high angular current density, the cathode 1 can have a shape combining a cylinder or rectangular box with a thickness m of 0.1 mm to 0.5 mm and a length n of 1 mm to 2 mm, and a cone having an electron emitting portion at the tip which is flat, with a diameter s of 2 μm to 100 μm.

[Production Method]

Next, an electron source production method according to the present embodiment shall be described.

(Preparation of Filament)

First, as a method of obtaining a filament 3 having a cross sectional shape in a direction perpendicular to the filament with a long direction and a short direction such that the maximum length in the long direction is at least 1.5 times and at most 5 times the maximum length in the short direction, there is a method of cutting a metallic sheet into strips. By this method, it is possible to uniformly and precisely obtain a filament with a rectangular cross section.

Additionally, there is a method of rolling a wire of circular cross section with a roller to obtain a wire of elliptical cross section having a long direction and a short direction. This method is preferable for enabling easy bulk processing.

(Preparation of Electron Source)

In order to prepare the electron source of the present embodiment, the above filament is bent in the shape of a V, and attached by welding to conductive terminals 4 anchored to an insulator 5. During attachment, the filament is arranged so that the long direction of the cross section of the filament is perpendicular to the plane formed by the three points of the cathode 1 and the two locations of attachment between the conductive terminals 4 and the filament 3.

The above plane is the plane passing through the center of the two attachment portions and the center of the monocrystalline cathode. Additionally, while the long direction of the filament cross section intersects perpendicularly with the above plane, the long direction may be tilted by ±10° or less, preferably ±5° or less with respect to the normal of the plane.

Next, a cathode 1 composed of tungsten monocrystals in the <100> orientation for emitting an electron beam is mounted by welding or the like to the top portion of the filament 3.

Next, the tip portion of the cathode 1 is sharpened by electrolytic polishing, a zirconium reservoir is formed on a side surface of a central portion and heated in the presence of oxygen at about $10^{-4}$ Pa to diffuse the zirconium and oxygen to the tip portion of the cathode 1 (hereinafter referred to as an oxygen treatment), then electrodes are attached and a voltage is applied in a vacuum of about $10^{-7}$ Pa to form the shape of the tip portion of the cathode 1.

Due to this structure, the occurrence of noise due to vibrations in the perpendicular direction with respect to the plane of the filament 3 mounted in the shape of a V caused by external vibrations can be held extremely small, increases in the current necessary for electrically heating the filament can be suppressed, and the current can be held to within the current capacity of an electron beam apparatus.

The above electron source can be used as an electron beam apparatus such as a scanning electron microscope, a scanning transmission electron microscope, an Auger electron spectroscope, an electron beam lithography apparatus or a wafer inspection apparatus. The electron beam apparatus using this electron source can achieve high resolutions without the need to provide any vibration preventing structures on the outside, and can achieve high reliability at low cost.

<Functions and Effects>

Herebelow, the functions and effects of the electron source and electron beam apparatus according to the above embodiment shall be described.

The above-described embodiment offers an electron source comprising an insulator 5; a pair of conductive terminals 4 arranged on the insulator 5; a filament 3 mounted between the conductive terminals 4; and a needle cathode 1 having an electron emitting portion attached to a portion of the filament 3; the cross sectional shape of said filament 3 in a direction perpendicular to an axial direction having a maximum length b in the short direction and a maximum length a in the long direction such that the ratio between the maximum length b in the short direction and the maximum length a in the long direction is at least 1.5 and at most 5; the filament being mounted so that the long direction of the cross sectional shape of the filament 3 is roughly perpendicular to the plane formed by the three points of the cathode 1 and the two locations where the filament 3 is attached to the pair of conductive terminals 4.

Due to the above structure, the filament can be shaped so as to be difficult to vibrate in a direction roughly perpendicular to the plane formed by the three points of the cathode 1 and the two locations of attachment between the filament 3 and the pair of conductive terminals 4, thereby increasing the rigidity without increasing the cross sectional area of the filament 3. Additionally, an apparatus using the above electron source will be such as to prevent the electron source from resonating due to vibrations from around the apparatus and thereby generating noise, and increases in the current necessary for electrically heating the filament can be suppressed.

The cross sectional shape of the filament 3 may be any shape capable of maintaining the above-indicated ratio between the maximum lengths in the long and short directions, and specifically may be rectangular, elliptical, diamond-shaped or rectangular with semicircular short sides.

When the filament 3 has a rectangular cross section, uniform and highly precise filaments can be obtained by cutting a metallic sheet into strips. Additionally, if the filament 3 is to have an elliptical cross section, it can be processed easily and in bulk by rolling a wire with a circular cross section using a roller or the like.

Additionally, the cross sectional area of the filament 3 should be at least 0.01 mm$^2$ and at most 0.015 mm$^2$. As a result, it can be heated with an appropriate current and vibrations of the cathode 1 can be suppressed.

Additionally, the length of the filament should be at least 3 mm and at most 8 mm. As a result, it can be heated with an appropriate current and vibrations of the cathode 1 can be suppressed.

Additionally, the angle between the filaments should be at least 30° and at most 120°. If the angle between the filaments 3 is at least 30°, the spacing between the conductive terminals 4 can be adequately maintained, and an electron source having a structure wherein the needle cathode projects from a hole provided in the suppressor electrode can be easily produced.

Furthermore, the filament 3 is preferably composed of a metal chosen from among tungsten, molybdenum, rhenium, tantalum and iridium, or an alloy containing at least one of these elements, since these are materials with high melting points.

Additionally, the cathode may be composed of tungsten or molybdenum, in the shape of a cylinder with a diameter (thickness m) of 0.1 mm to 0.15 mm and a length n of 1.0 mm to 1.8 mm, and a diameter s of 2 μm or less for the electron emitting portion at the tip. As a result, a brighter, stable electron source can be obtained.

Furthermore, the above cathode 1 is composed mainly of tungsten or molybdenum monocrystals in the <100> orientation, while a reservoir 2 of oxides of metal elements chosen from among Ca, Sr, Ba, Sc, Y, La, Ti, Zr, Hf and the lanthanides can be provided in a portion of the cathode 1. By using the above metal elements in the cathode 1 and the reservoir 2, highly bright electron emissions can be achieved stably for a long time, and an electron source with favorable properties can be obtained.

Additionally, the filament may be a cylinder or rectangular box with a thickness m of 0.1 mm to 0.5 mm and a length n of 1 mm to 2 mm, and the electron emitting portion at the tip may be flat, with a diameter s of 2 µm to 100 µm. As a result, a higher angular current density can be obtained.

The above-described electron source can be used as an electron beam apparatus such as a scanning electron microscope, a scanning transmission electron microscope, an Auger electron spectroscope, an electron beam lithography apparatus or a wafer inspection apparatus. In apparatus using the above electron source, noise generated by resonation of the electron source due to vibrations from around the apparatus can be prevented. Additionally, increases in the current necessary to electrically heat the filament can be suppressed, and held to within the current capacity of the electron beam apparatus.

While embodiments of the present invention have been described above with reference to the drawings, these merely illustrate examples of the present invention, and various structures other than the above are possible.

Additionally, the above electron beam apparatus may comprise a suppressor electrode for suppressing unwanted thermal electrons that are emitted by sending a heating current to the filament holding the cathode. Electron beam apparatus comprising a suppressor electrode of this type can suppress emission of unwanted thermal electrons, and can reduce the possibility of vacuum degradation and discharge damage caused by excess electrons striking the extractor electrode, thereby enabling an electron of high uniformity to be obtained.

Examples

Example 1

By rolling a tungsten filament with a diameter of 0.125 mm, a filament having a cross section with a length of 0.22 mm in the long direction and a length of 0.07 mm in the short direction was obtained. Therefore, the length in the long direction was roughly three times the length in the short direction. Additionally, the cross sectional area of the filament was 0.012 mm$^2$.

The above-described tungsten filament was bent in the shape of a V. When processing the filament into a V shape, it was arranged so that the long direction of the cross section is roughly perpendicular to the plane formed by bending the filament. Additionally, the angle between the filament shaped into a V was 60°.

Subsequently, the above filament was attached by spot welding between a pair of conductive terminals brazed to an insulator. Then, a cathode of monocrystalline tungsten in the <100> orientation was attached to the filament by spot welding. Furthermore, an end of the cathode different from the electron emitting portion was attached by spot welding to a metal terminal affixed to the central portion of the insulator.

Next, the tip portion of the cathode was sharpened by electrolytic polishing. Then, a paste formed by crushing zirconium hydride and mixing with isoamyl acetate was applied to a portion of the cathode, and subjected to an oxygen treatment by heating in the presence of oxygen at about $10^{-4}$ Pa, to obtain the electron source of the structure shown in FIG. 1 and FIG. 2. The length from one end of the filament to the point of contact between the cathode and the filament was set to 5 mm.

Figure 6:
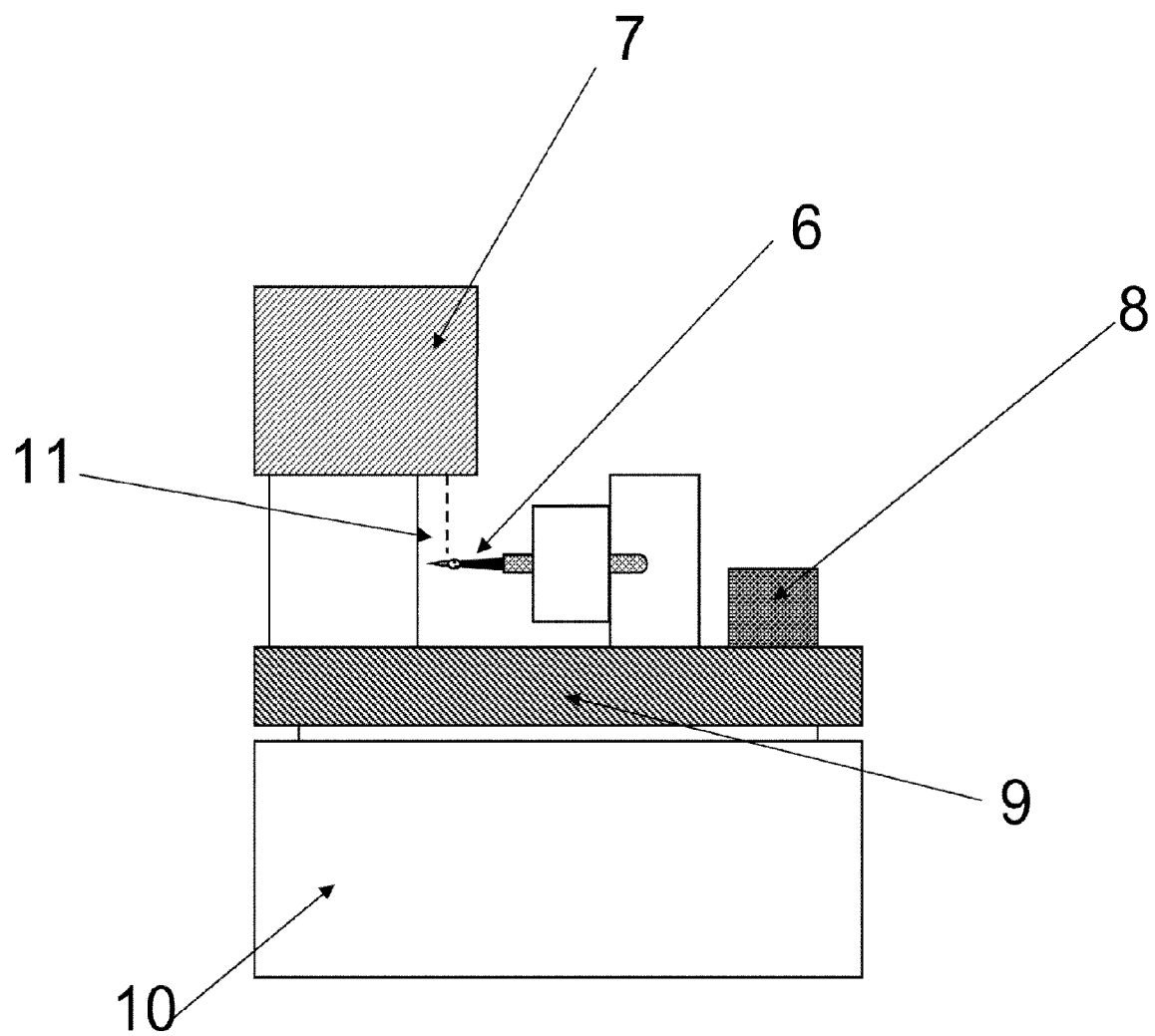
FIG. 6 A diagram showing the structure of a device for evaluating the resonance amplitude of the electron source.

FIG. 6 is a diagram showing the structure of a device for evaluating the resonance amplitude of the electron source. In the structure shown, the electron source 6 was mounted on a vibration plate 9 having an acceleration sensor 8 (PCB 352B) and a laser displacement meter 7 (Keyence LK-G30), such that the virtual plane formed by the filament mounted on the electron source 6 in the shape of a V is parallel to the vibrating plate 9. Then, the vibrational displacement of the cathode when subjecting the vibrating plate 9 to sinusoidal vibrations of a predetermined frequency by a vibration generator 10 was monitored by the laser displacement meter 7.

The resonance amplitude of the electron source 6 was evaluated as a normalized amplitude W/A (m/m/s$^2$) computed as the amplitude W (m) at the frequency F at which the amplitude of vibrational displacement of the cathode was greatest when changing the frequency of the vibrating plate 9, divided by the acceleration A (m/s$^2$) measured by the acceleration sensor 8.

Furthermore, the filament current needed for electrically heating in a vacuum to 1800 K, which is a suitable operating temperature for the ZrO/W electron source, was measured.

Example 2

A tungsten filament with a diameter of 0.150 mm was rolled to obtain a filament having a cross section with a length of 0.26 mm in the long direction and a length of 0.09 mm in the short direction. Consequently, the length in the long direction was roughly three times the length in the short direction. Additionally, the cross sectional area of the filament was 0.018 mm$^2$. An electron source was prepared in otherwise the same way as in Example 1, and evaluated in the manner indicated above.

As described above, electron sources having different cross sectional areas were evaluated in Examples 1 and 2. The results are shown in Table 1.

Example 3

An electron source was prepared in the same manner as Example 1, except that the length from one end of the filament to the point of contact between the cathode and the filament was set to 3 mm, and the above evaluations were performed.

Example 4

An electron source was prepared in the same manner as Example 1, except that the length from one end of the filament to the point of contact between the cathode and the filament was set to 8 mm, and the above evaluations were performed.

As described above, in Examples 3 and 4, electron sources having filaments of various lengths were evaluated. The results are shown in Table 1.

Example 5

A tungsten filament with a diameter of 0.125 mm was rolled to obtain a filament having a cross section with a length of 0.18 mm in the long direction and a length of 0.09 mm in the short direction. Consequently, the length in the long direction was roughly twice the length in the short direction. An electron source was prepared in otherwise the same way as in Example 1, and evaluated in the manner indicated above.

Example 6

A tungsten filament with a diameter of 0.125 mm was rolled to obtain a filament having a cross section with a length of 0.25 mm in the long direction and a length of 0.06 mm in the short direction. Consequently, the length in the long direction was roughly four times the length in the short direction. An electron source was prepared in otherwise the same way as in Example 1, and evaluated in the manner indicated above.

As described above, in Examples 5 and 6, electron sources with different ratios between the length in the long direction and the length in the short direction of the filament cross section were evaluated. The results are shown in Table 1.

TABLE 1

| | n | Resonance Frequency [Hz] | Normalized Amplitude [m/m/s$^2$] | Filament Current when Heating to 1800 K [A] | Filament Cross Section Area [mm$^2$] | Filament Length [mm] | Filament Angle [°] | Ratio of Max Length a in Long Direction to Max Length b in Short Direction |
|---|---|---|---|---|---|---|---|---|
| Ex 1 | 1 | 4548 | 3.4 × 10$^{-6}$ | 2.65 | 0.012 | 5 | 60 | 3 |
|  | 2 | 4740 | 2.5 × 10$^{-6}$ | 2.77 | | | | |
|  | 3 | 4563 | 1.7 × 10$^{-6}$ | 2.70 | | | | |
| Ex 2 | 1 | 5706 | 1.6 × 10$^{-6}$ | 2.96 | 0.018 | 5 | 60 | 3 |
|  | 2 | 5734 | 0.7 × 10$^{-6}$ | 2.89 | | | | |
|  | 3 | 5868 | 1.0 × 10$^{-6}$ | 2.98 | | | | |
| Ex 3 | 1 | 9834 | 0.7 × 10$^{-6}$ | 2.94 | 0.012 | 3 | 60 | 3 |
|  | 2 | 9956 | 0.4 × 10$^{-6}$ | 2.93 | | | | |
|  | 3 | 9902 | 0.5 × 10$^{-6}$ | 2.88 | | | | |
| Ex 4 | 1 | 2365 | 8.5 × 10$^{-6}$ | 2.36 | 0.012 | 8 | 60 | 3 |
|  | 2 | 2382 | 1.1 × 10$^{-5}$ | 2.24 | | | | |
|  | 3 | 2273 | 1.0 × 10$^{-5}$ | 2.13 | | | | |
| Ex 5 | 1 | 4008 | 8.5 × 10$^{-6}$ | 2.63 | 0.012 | 5 | 60 | 2 |
|  | 2 | 3863 | 9.1 × 10$^{-6}$ | 2.50 | | | | |
|  | 3 | 3669 | 1.2 × 10$^{-5}$ | 2.67 | | | | |
| Ex 6 | 1 | 8620 | 0.5 × 10$^{-6}$ | 2.88 | 0.012 | 5 | 60 | 4 |
|  | 2 | 7599 | 0.3 × 10$^{-6}$ | 2.91 | | | | |
|  | 3 | 8998 | 0.5 × 10$^{-6}$ | 2.95 | | | | |

Comparative Example 1

Figure 7:
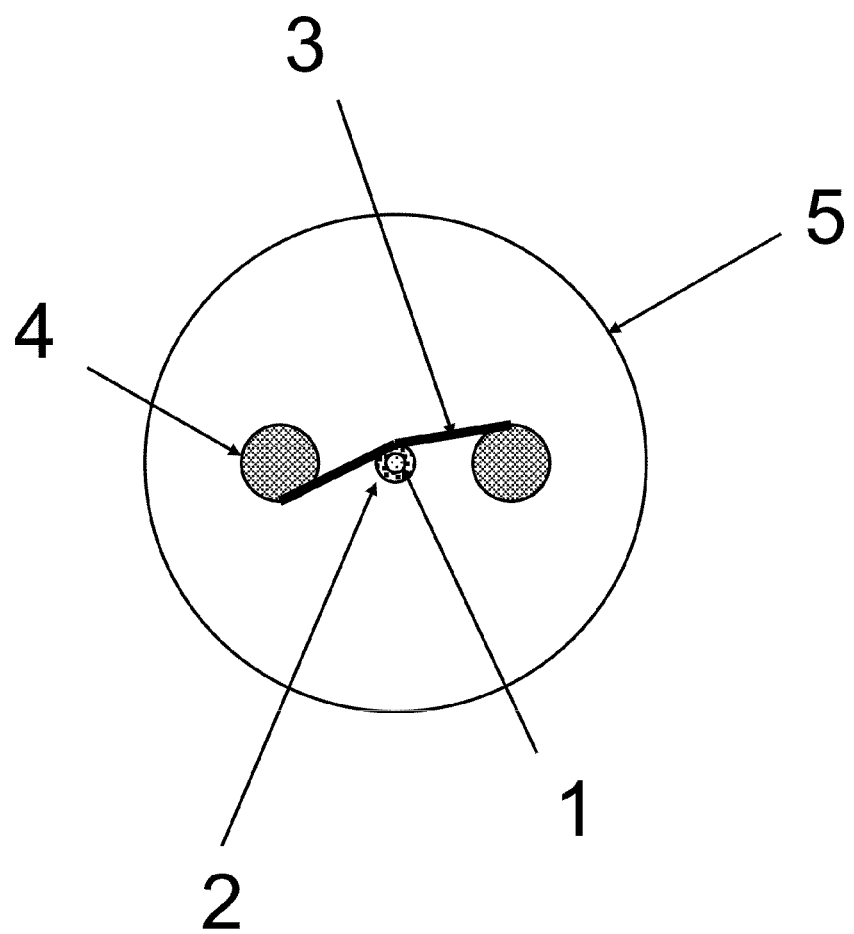
FIG. 7 A diagram showing the structure of a conventionally known electron source according to a comparative example (the electron source as seen from the direction of the cathode).

Resonance tests and measurements of the filament current when heating to 1800 K were performed in the same manner as in Example 1, on an electron source with the conventional structure shown in FIG. 7, in other words, produced by the same method as Example 1, aside from the fact that a filament with a circular cross section having a diameter of 0.125 mm was used.

Comparative Example 2

The same evaluations as in the examples were performed on an electron source produce by the same method as Comparative Example 1, except that a filament with a circular cross section having a diameter of 0.15 mm was used. The results are shown in Table 2.

Comparative Example 3

A tungsten filament with a diameter of 0.125 mm was rolled to obtain a filament having a cross section with a length of 0.31 mm in the long direction and a length of 0.05 mm in the short direction. Consequently, the length in the long direction was roughly six times the length in the short direction. An electron source was prepared in otherwise the same way as in Example 1, and evaluated in the manner indicated above. The results are shown in Table 2.

TABLE 2

| | n | Resonance Frequency [Hz] | Normalized Amplitude [m/m/s$^2$] | Filament Current when Heating to 1800 K [A] | Filament Cross Section Area [mm$^2$] | Filament Length [mm] | Filament Angle [°] | Ratio of Max Length a in Long Direction to Max Length b in Short Direction |
|---|---|---|---|---|---|---|---|---|
| Comp Ex 1 | 1 | 2657 | 2.3 × 10$^{-5}$ | 2.37 | 0.012 | 5 | 60 | 1 |
|  | 2 | 2636 | 2.5 × 10$^{-5}$ | 2.35 | | | | |
|  | 3 | 2534 | 2.5 × 10$^{-5}$ | 2.34 | | | | |
| Comp Ex 2 | 1 | 3586 | 1.0 × 10$^{-5}$ | 3.10 | 0.018 | 5 | 60 | 1 |
|  | 2 | 3454 | 1.2 × 10$^{-5}$ | 3.13 | | | | |
|  | 3 | 3608 | 1.0 × 10$^{-5}$ | 3.19 | | | | |
| Comp Ex 3 | 1 | 12550 | 0.1 × 10$^{-6}$ | 3.30 | 0.012 | 5 | 60 | 6 |
|  | 2 | 13301 | 0.1 × 10$^{-6}$ | 3.14 | | | | |
|  | 3 | 12230 | 0.1 × 10$^{-6}$ | 3.33 | | | | |

<Analysis>

The results of n=3 tests performed on each the above Examples 1-6 and Comparative Examples 1-3 are shown in Table 1 and Table 2.

It was confirmed that the resonance frequencies F of the examples were higher than that of Comparative Example 1, and the normalized amplitude W/A was significantly suppressed as compared with Comparative Example 1. Additionally, the filament current necessary for heating to 1800 K in the examples was slightly greater than in Comparative Example 1, but it was 3 A or less, which does not present a problem for practical application.

On the other hand, while the normalized amplitude W/A of Comparative Example 2 was reduced to half that of Comparative Example 1, the filament current necessary for heating to 1800 K exceeded 3 A in Comparative Example 2, which places considerable restrictions on practical application.

When comparing Comparative Example 1 and Comparative Example 2, the normalized amplitude was reduced when the area of the filament cross section was made larger, but the filament current needed for heating to 1800 K increased. On the other hand, the electron source of the present embodiment had the notable effect of reducing the normalized amplitude over an electron source using a circular filament of roughly the same cross sectional area (Comparative Example 1).

As described above, the electron sources according to Examples 1-6 of the present invention are capable of maintaining adequate rigidity without expanding the cross sectional area of the filament, thereby preventing resonation of the electron source due to vibrations from around the apparatus and noise caused thereby.

Furthermore, since the maximum length in the long direction of the cross sectional shape of the filament is set to be at least 1.5 times and at most 5 times the maximum length in the short direction, it can be heated with an appropriate current.

The invention claimed is:

1. An electron source comprising:
   an insulator;
   two conductive terminals arranged spaced apart on said insulator;
   two long filaments mounted between said conductive terminals; and
   a needle cathode attached to said two filaments and having an electron emitting portion;
   the cross sectional shape of said two filaments in a direction perpendicular to an axial direction having a long direction and a short direction;
   the maximum length in the long direction being at least 1.5 times and at most 5 times the maximum length in the short direction; and
   said two filaments being mounted such that the long direction of the cross sectional shape of said two filaments have has an angle of ±10° with respect to the normal to the plane formed by three points which are the position of said cathode and the two positions where said filament is attached to said conductive terminals, wherein the angle between said two filaments is at least 30° and at most 120°.

2. An electron source in accordance with claim 1, wherein the cross sectional shapes of said two filaments are rectangular, elliptical, diamond-shaped or rectangular with short sides that are semicircular.

3. An electron source in accordance with claim 1, wherein the cross sectional areas of said two filaments are at least 0.01 $mm^2$ and at most 0.015 $mm^2$.

4. An electron source in accordance with claim 1, wherein the length of each said two filaments is at least 3 mm and at most 8 mm.

5. An electron source in accordance with claim 1, wherein said two filaments are composed of a metal chosen from among tungsten, molybdenum, rhenium, tantalum and iridium, or an alloy containing at least one chosen from among these elements.

6. An electron source in accordance with claim 1, wherein said cathode consists of tungsten or molybdenum, and has a shape combining a cylinder with a diameter of 0.1 mm to 0.15 mm and a length of 1.0 mm to 1.8 mm, and a cone with a diameter of 2 μm or less at an electron emitting portion on a tip portion.

7. An electron source in accordance with claim 1, wherein said cathode is composed mainly of tungsten or molybdenum monocrystals in the <100> orientation, and a portion of said cathode has a reservoir of oxides of metallic elements chosen from among Ca, Sr, Ba, Sc, Y, La, Ti, Zr, Hf and the lanthanides.

8. An electron source in accordance with claim 1, wherein said cathode has a shape combining a cylinder or a rectangular box with a thickness of 0.1 mm to 0.5 mm and a length of 1 mm to 2 mm, and a cone with an electron emitting portion at a tip portion which is flat and has a diameter of 2 μm to 100 μm.

9. An electron beam apparatus comprising an electron source in accordance with claim 1.

* * * * *

UNITED STATES PATENT AND TRADEMARK OFFICE
CERTIFICATE OF CORRECTION

PATENT NO. : 8,519,608 B2  
APPLICATION NO. : 12/680918  
DATED : August 27, 2013  
INVENTOR(S) : Nonogaki et al.

Page 1 of 1

It is certified that error appears in the above-identified patent and that said Letters Patent is hereby corrected as shown below:

On the title page  
At item [30] under "Foreign Application Priority Data," "Mar. 11, 2008 (JP).............2008-054359" should read -- Mar. 11, 2008 (JP).............PCT/JP2008/054359 --.

Signed and Sealed this  
Tenth Day of December, 2013

Margaret A. Focarino  
*Commissioner for Patents of the United States Patent and Trademark Office*